(12) United States Patent
Watanabe et al.

(10) Patent No.: US 12,074,012 B2
(45) Date of Patent: Aug. 27, 2024

(54) ACTIVE GAS GENERATION APPARATUS

(71) Applicant: TOSHIBA MITSUBISHI-ELECTRIC INDUSTRIAL SYSTEMS CORPORATION, Tokyo (JP)

(72) Inventors: Kensuke Watanabe, Tokyo (JP); Ren Arita, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 133 days.

(21) Appl. No.: 17/789,793

(22) PCT Filed: Dec. 7, 2020

(86) PCT No.: PCT/JP2020/045380
§ 371 (c)(1),
(2) Date: Jun. 29, 2022

(87) PCT Pub. No.: WO2022/123615
PCT Pub. Date: Jun. 16, 2022

(65) Prior Publication Data
US 2023/0034041 A1    Feb. 2, 2023

(51) Int. Cl.
*H01J 37/32* (2006.01)
(52) U.S. Cl.
CPC .. *H01J 37/32568* (2013.01); *H01J 37/32348* (2013.01); *H01J 37/3244* (2013.01); *H01J 37/32449* (2013.01); *H01J 37/32522* (2013.01); *H01J 2237/002* (2013.01); *H01J 2237/038* (2013.01)

(58) Field of Classification Search
None
See application file for complete search history.

(56) References Cited

U.S. PATENT DOCUMENTS

2014/0123897 A1* 5/2014 Tabata ................. C23C 16/452
  315/111.21
2020/0343078 A1   10/2020 Watanabe et al.

FOREIGN PATENT DOCUMENTS

| TW | 200901833 A | 1/2009 |
| TW | 201930637 A | 8/2019 |
| WO | 2019/229873 A1 | 12/2019 |

OTHER PUBLICATIONS

International Search Report and Written Opinion mailed on Feb. 9, 2021, received for PCT Application PCT/JP2020/045380, filed on Dec. 7, 2020, 8 pages including English Translation.
(Continued)

*Primary Examiner* — Renan Luque
(74) *Attorney, Agent, or Firm* — XSENSUS LLP

(57) ABSTRACT

An active gas generation apparatus according to the present disclosure includes: a base flange having a central bottom surface region and a peripheral protruding part; a cooling plate provided on the peripheral protruding part of the base flange; an insulating plate provided between the cooling plate and the high voltage apply electrode part; and an electrode holding member provided on a lower surface of the cooling plate to support the high voltage apply electrode part from a lower side. Provided is a gas separation structure of separating a gas flow between an in-housing space and a discharge space by the cooling plate, the electrode holding member, and the high voltage apply electrode part.

5 Claims, 12 Drawing Sheets

(56) References Cited

OTHER PUBLICATIONS

International Search Report and Written Opinion mailed on Sep. 7, 2021, received for PCT Application PCT/JP2021/024082, filed on Jun. 25, 2021, 9 pages including English Translation.
Taiwanese Office Action issued Jul. 25, 2022 in corresponding Taiwanese Patent Application No. 110144620 (with machine-generated English translation), 12 pages.

* cited by examiner

ACTIVE GAS GENERATION APPARATUS

CROSS-REFERENCE TO RELATED APPLICATION

The present application is based on PCT filing PCT/JP2020/045380, filed Dec. 7, 2020, the entire contents of which is incorporated herein by reference.

TECHNICAL FIELD

The present disclosure relates to an active gas generation apparatus generating active gas by parallel plate type dielectric-barrier charge and supplying the active gas to a processing space in a subsequent stage.

BACKGROUND ART

For example, an active gas generation apparatus disclosed in Patent Document 1 is an example of an active gas generation apparatus generating active gas by parallel plate type dielectric-barrier charge.

In a conventional active gas generation apparatus disclosed in Patent Document 1, a processing space such as a processing chamber is located in a subsequent stage of the apparatus.

The conventional active gas generation apparatus generates active gas such as nitrogen radical from material gas such as nitrogen gas using dielectric-barrier discharge, and ejects the active gas into the processing space.

PRIOR ART DOCUMENTS

Patent Documents

Patent Document 1: International Publication No. 2019/229873

SUMMARY

Problem to be Solved by the Invention

The conventional active gas generation apparatus has a structure that gas which has passed through a high voltage supply space to which a metal electrode for applying high voltage provided in a high voltage side electrode is exposed is led to a discharge space. In this case, when a component of the metal electrode or the like is evaporated by high temperature or abnormal electrical discharge, the component enters the discharge space as it is, and may cause particles or metal contamination in semiconductor forming processing performed in the processing space.

That is to say, the conventional active gas generation apparatus has a problem that it may fail to output high-quality active gas.

An object of the present disclosure is to solve the above problem and provide an active gas generation apparatus having a structure of ejecting high-quality active gas which does not contain impurity by devising a shape and attachment structure of an electrode constituting part and a peripheral part thereof.

Means to Solve the Problem

An active gas generation apparatus according to the present disclosure is an active gas generation apparatus generating active gas obtained by activating material gas supplied to a discharge space, including: a first electrode constituting part; and a second electrode constituting part provided on a lower side of the first electrode constituting part, wherein the first electrode constituting part includes a first electrode dielectric film and a first metal electrode formed on an upper surface of the first electrode dielectric film, the second electrode constituting part includes a second electrode dielectric film and a second metal electrode formed on a lower surface of the second electrode dielectric film, AC voltage is applied to the first metal electrode, the second metal electrode is set to ground potential, and a dielectric space where the first and second electrode dielectric films face each other includes a region where the first and second metal electrodes overlap with each other in a plan view as the discharge space, the second electrode dielectric film includes a gas ejection hole for ejecting the active gas to a lower side, the active gas generation apparatus further comprising a base flange having conductivity, having a cross-section structure with a concave shape, and including a central bottom surface region and a peripheral protruding part provided along an outer periphery of the central bottom surface region to protrude in a height direction, wherein the second electrode constituting part is provided so that the second metal electrode has contact with the central bottom surface region, the active gas generation apparatus further comprising: a cooling plate provided on the peripheral protruding part of the base flange and located above an upper side of the first electrode constituting part without contact with the first electrode constituting part; an insulating material provided between the cooling plate and the first electrode constituting part, having an upper surface having contact with a lower surface of the cooling plate, and having a lower surface having contact with the upper surface of the first metal electrode; an electrode support member provided on the lower surface of the cooling plate to support the first electrode constituting part from a lower side; and a metal housing provided on the peripheral protruding part of the base flange and having an in-housing space housing the cooling plate, wherein the base flange includes: a gas supply port receiving the material gas from outside; a gas transmission path for supplying the material gas to the discharge space; a cooling medium supply port receiving a cooling medium from outside; a cooling medium transmission hole for supplying the cooling medium to the cooling plate; and a base flange gas ejection hole for ejecting active gas ejected from the gas ejection hole to a lower side; ground potential is supplied to the base flange, the cooling plate includes a cooling medium path transmitting the cooling medium supplied through the cooling medium transmission hole to an inner portion, and provided is a gas separation structure of separating a gas flow between the in-housing space and the discharge space by the cooling plate, the electrode support member, and the first electrode constituting part.

Effects of the Invention

The active gas generation apparatus according to the present disclosure has the gas separation structure described above, thereby being able to reliably avoid a phenomenon that the impurity occurring in the in-housing space enters the discharge space.

As a result, the active gas generation apparatus according to the present disclosure can eject the high-quality active gas which does not contain impurity without damaging the first and second electrode dielectric films.

Furthermore, the first metal electrode can be cooled by the cooling plate having the cooling medium path via the insulating material. Thus, a difference of temperature between regions in the dielectric film occurring in the first electrode dielectric film having the lower surface forming the discharge space can be reduced as small as possible.

As a result, the active gas generation apparatus according to the present disclosure can increase the discharge power applied to the discharge space by suppressing the difference of temperature between regions in the dielectric film, thus can increase a generation amount of the active gas.

These and other objects, features, aspects and advantages of the present disclosure will become more apparent from the following detailed description of the present disclosure when taken in conjunction with the accompanying drawings.

DESCRIPTION OF EMBODIMENT(S)

Embodiment 1

(Whole Configuration)

Figure 1:
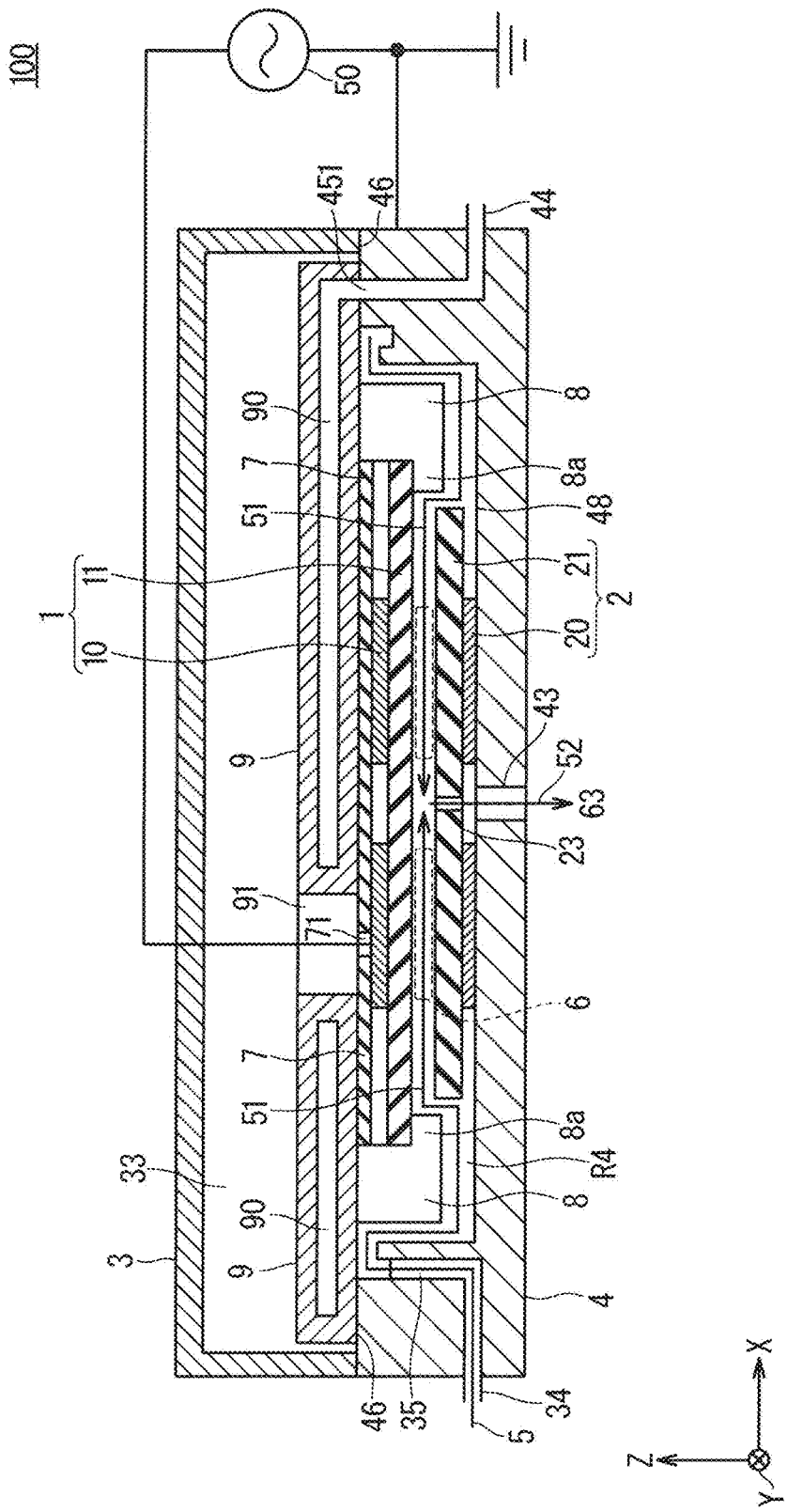
FIG. 1 An explanation diagram illustrating a whole configuration of an active gas generation apparatus which is an embodiment 1 of the present disclosure.

FIG. 1 is an explanation diagram illustrating a whole configuration of an active gas generation apparatus which is an embodiment 1 of the present disclosure. An XYZ rectangular coordinate system is illustrated in FIG. 1. An active gas generation apparatus 100 according to the embodiment 1 is an active gas generation apparatus generating active gas 52 (nitrogen radical, for example) obtained by activating material gas 5 (nitrogen gas, for example) supplied to a discharge space 6.

The active gas generation apparatus 100 includes, as a main constituting part, a metal housing 3, a base flange 4, a high voltage apply electrode part 1, a ground potential electrode part 2, an insulating plate 7, an electrode holding member 8, and a cooling plate 9.

The base flange 4 has a cross-section structure with a concave shape, and includes a central bottom surface region 48 and a peripheral protruding part 46 provided along an outer periphery of the central bottom surface region 48 to protrude in a height direction (+Z direction). The base flange 4 is set to ground potential.

The metal housing 3 is a housing made of metal with an opening part on a lower side. The metal housing 3 mainly includes an in-housing space 33 housing the cooling plate 9.

The metal housing 3 is fixed to the base flange 4 so that the metal base flange 4 constitutes a bottom surface of the metal housing 3. Specifically, the metal housing 3 is fixed on the peripheral protruding part 46 of the base flange 4. Accordingly, the opening part of the metal housing 3 is shielded by the base flange 4, and the metal housing 3 and the base flange 4 form a shielded space including the in-housing space 33. The metal housing 3 is further set to ground potential via the base flange 4.

The cooling plate 9 is disposed as a bottom surface part of the in-housing space 33 in the active gas generation apparatus 100. Specifically, the cooling plate 9 is disposed on an upper surface of the peripheral protruding part 46 of the base flange 4 so that a peripheral end portion of the cooling plate 9 has contact with the upper surface of the peripheral protruding part 46 of the base flange 4. At this time, the cooling plate 9 is disposed not to have contact with the metal housing 3.

In the meanwhile, the ground potential electrode part 2 which is a second electrode constituting part is disposed on the central bottom surface region 48 of the base flange 4. The ground potential electrode part 2 includes, as a main constituting part, an electrode dielectric film 21 which is a second electrode dielectric film and a metal electrode 20 which is a second metal electrode formed on a lower surface of the electrode dielectric film 21. Accordingly, the ground potential electrode part 2 is placed on the central bottom surface region 48 so that the metal electrode 20 has contact with the central bottom surface region 48.

A combination of the high voltage apply electrode part 1 which is a first electrode constituting part and the ground potential electrode part 2 which is a second electrode constituting part constitutes an electrode pair having the discharge space 6 in an inner portion, and the ground potential electrode part 2 is provided on a lower side of the high voltage apply electrode part 1.

The high voltage apply electrode part 1 includes, as a main constituting part, an electrode dielectric film 11 which is a first electrode dielectric film and a metal electrode 10 which is a first metal electrode formed on an upper surface of the electrode dielectric film 11.

The metal electrode 10 is provided on an upper surface of the electrode dielectric film 11 using sputtering method and print-baking method, for example, and the metal electrode 20 is provided on a lower surface of the electrode dielectric film 21 using sputtering method and print-baking method, for example.

AC voltage is applied between the metal electrode 10 and the metal electrode 20 from a high frequency power source 50. Specifically, the AC voltage is applied from the high frequency power source 50 to the metal electrode 10, and the metal electrode 20 is set to ground potential via the base flange 4.

The discharge space 6 including a region where the metal electrodes 10 and 20 overlap with each other in a plan view is provided in a shielded space functioning as a dielectric space where the electrode dielectric film 11 and the electrode dielectric film 21 face each other.

The electrode dielectric film 21 includes a gas ejection hole 23 for ejecting the active gas 52 into a processing space 63 on a lower side (subsequent stage) via a gas ejection hole 43 of the base flange 4.

The gas ejection hole 43 (a base flange gas ejection hole) is provided in a position corresponding to the gas ejection hole 23 of the electrode dielectric film 21 without an intervention of the metal electrode 20 in a central portion of the central bottom surface region 48 of the base flange 4.

As described above, the cooling plate 9 is fixed on the peripheral protruding part 46 of the base flange 4. The insulating plate 7 is provided on a lower surface of the cooling plate 9, and the high voltage apply electrode part 1 is disposed so that an upper surface of the metal electrode 10 has contact with the lower surface of the insulating plate 7.

The electrode holding member 8 functioning as an electrode support member is provided on the lower surface of the cooling plate 9. The electrode holding member 8 is provided in an outer peripheral region of the insulating plate 7 and the high voltage apply electrode part 1. A combination structure of the insulating plate 7 and the high voltage apply electrode part 1 is referred to as "an upper electrode group" in an abbreviated form in some cases.

The electrode holding member 8 includes a pressing protruding part 8a whose lower side partially protrudes to an inner side (a formation direction of the upper electrode group). The pressing protruding part 8a is provided to protrude to the inner side along a horizontal direction (XY plane) so that an upper surface thereof has contact with a lower surface of the electrode dielectric film 11.

The pressing protruding part 8a of the electrode holding member 8 and the cooling plate 9 sandwich the upper electrode group, thereby fixing the upper electrode group on the lower surface of the cooling plate 9.

Accordingly, the electrode holding member 8 functions as the electrode support member provided on the lower surface of the cooling plate 9 to support the high voltage apply electrode part 1 from a lower side.

A stainless-steel bolt is used to attach the electrode holding member 8 to the cooling plate 9, and there is a possibility that impurity of a stainless-steel component enters the discharge space 6 when the bolt is exposed to a gas flow 51 of the material gas 5 in a gas relay region R4 described hereinafter. Thus, all of the bolts are attached from a side of the in-housing space 33 toward the electrode holding member 8 via the cooling plate 9. The illustration of the bolt is omitted. In this manner, the electrode holding member 8 is attached to the lower surface of the cooling plate 9 so that the upper electrode group is sandwiched between the pressing protruding part 8a and the cooling plate 9.

The plate-like insulating plate 7 which is an insulating material is provided between the cooling plate 9 and the high voltage apply electrode part 1, and an upper surface thereof has contact with the lower surface of the cooling plate 9, and a lower surface thereof has contact with the upper surface of the metal electrode 10 of the high voltage apply electrode part 1.

Accordingly, the cooling plate 9 is located above an upper side of the high voltage apply electrode part 1 without contact with the high voltage apply electrode part 1 in accordance with an intervention of the insulating plate 7.

In this manner, in the active gas generation apparatus 100, the high voltage apply electrode part 1 is not placed on the ground potential electrode part 2 with a spacer therebetween but has a feature of being attached to the cooling plate 9 on the upper side.

The active gas generation apparatus 100 has the above feature, thus a positioning of a height direction of the cooling plate 9 can be determined only by a contact surface of the base flange 4 and the peripheral protruding part 46. That is to say, the height direction of the cooling plate 9 can be positioned only by a formation height of an upper surface of the peripheral protruding part 46 of the base flange 4.

Thus, the active gas generation apparatus 100 sets a formation position of the cooling plate 9 accurately, thereby being able to completely prevent a gas leakage and a cooling water leakage between the cooling plate 9 and the base flange 4.

The base flange 4 includes a gas supply port 34 in one side surface of the peripheral protruding part 46 and a gas transmission path 35 in an inner portion of the peripheral protruding part 46. The material gas 5 supplied from outside flows from the gas supply port 34 to the gas transmission path 35.

In addition, the base flange 4 includes a gas relay region R4 functioning as a region relaying the material gas 5 from the gas transmission path 35 to the discharge space 6 on an upper side of the central bottom surface region 48 (and mainly on a lower side of the electrode holding member 8).

Accordingly, the material gas 5 flowing in the gas transmission path 35 is finally supplied to the discharge space 6 via the gas relay region R4. To be exact, a gas buffer 41 and a gas diffusion path 42 described hereinafter are located between the gas transmission path 35 and the gas relay region R4.

In this manner, the base flange 4 includes the gas supply port 34 receiving the material gas 5 from outside and the gas transmission path 35 for supplying the material gas 5 to the discharge space 6.

The gas relay region R4 described above is completely separated from the in-housing space 33 by the high voltage apply electrode part 1 (the first electrode constituting part), the cooling plate 9, the insulating plate 7 (insulating material), the electrode holding member 8, and the cooling plate 9.

In order to achieve the complete separation described above, each of a contact surface of the cooling plate 9 and the base flange 4, a contact surface of the cooling plate 9 and the electrode holding member 8, and a contact surface of the electrode holding member 8 and the high voltage apply electrode part 1 is sealed by an O ring (each O ring is not shown).

Accordingly, a gas flow between the in-housing space 33 and the discharge space 6 is separated by at least the electrode holding member 8, the cooling plate 9, and the high voltage apply electrode part 1.

That is to say, the material gas 5 flowing in the gas relay region R4 does not enter the in-housing space 33, and impurity, for example, in the in-housing space 33 does not enter the discharge space 6 via the gas relay region R4 in reverse.

The base flange 4 includes a cooling water supply port 44 in the other side surface of the peripheral protruding part 46 on a side opposite to one side surface thereof. Cooling water which is a cooling medium supplied from outside flows in an inner portion of the peripheral protruding part 46 and is supplied from a cooling water transmission hole 451 to the cooling plate 9.

The cooling plate 9 includes, in an inner portion, a cooling water path 90 functioning as a cooling medium path transmitting the cooling water supplied through the cooling water transmission hole 451. Accordingly, the cooling plate 9 has a cooling function of flowing the cooling water in the cooling water path 90, thereby cooling the high voltage apply electrode part 1 (the electrode dielectric film 11) via the insulating plate 7.

In this manner, the base flange 4 includes the cooling water supply port 44 which is the cooling medium supply port receiving the cooling water which is the cooling medium and the cooling water transmission hole 451 which is the cooling medium transmission hole for supplying the cooling water to the cooling plate 9.

A procedure of attaching the active gas generation apparatus 100 having the above configuration is briefly described hereinafter.

(1) The cooling plate 9 is turned over to reverse a relationship between the upper surface and the lower surface of the cooling plate 9.

(2) The insulating plate 7 is placed on the lower surface of the cooling plate 9.

(3) The high voltage apply electrode part 1 is placed on the insulating plate 7 so that the metal electrode 10 and the electrode dielectric film 11 are placed in this order.

(4) The electrode holding member 8 is placed on the lower surface of the cooling plate 9 to secure the cooling plate 9 and the electrode holding member 8 with a bolt. At this time, a portion between the cooling plate 9 and the electrode holding member 8 and a portion between the high voltage apply electrode part 1 and the electrode holding member 8 are sealed.

(5) The ground potential electrode part 2 is placed on the central bottom surface region 48 of the base flange 4.

(6) The cooling plate 9 to which the upper electrode group is returned to have the original up-down relationship.

(7) The cooling plate 9 is placed on the peripheral protruding part 46 of the base flange 4, and the cooling plate 9 and the base flange 4 are secured with a bolt. At this time, a portion between the cooling plate 9 and the base flange 4 are sealed.

In this manner, the active gas generation apparatus 100 according to the embodiment 1 can be assembled through the attachment procedures (1) to (7).

In the active gas generation apparatus 100 assembled as described above, the material gas 5 is supplied from the gas supply port 34 provided in one side surface of the peripheral protruding part 46 of the base flange 4 into the base flange 4.

In the peripheral protruding part 46 of the base flange 4, the gas flow 51 of the material gas 5 passes through the gas buffer 41 and the gas diffusion path 42 described hereinafter from the gas transmission path 35 toward the gas relay region R4. The gas flow 51 passes from the gas relay region R4 toward the discharge space 6 between the high voltage apply electrode part 1 and the ground potential electrode part 2. The material gas 5 passes through the discharge space 6 to which discharge power is applied, thus the material gas 5 is activated, and the active gas 52 is obtained. The active gas 52 is supplied to the processing space 63 on the lower side via the gas ejection hole 23 and the gas ejection hole 43.

At this time, the in-housing space 33 can be set to have a wide pressure range from around atmospheric pressure of approximately 100 kPa to high vacuum of approximately $1 \times 10^{-1}$ Pa to $1 \times 10^{-3}$ Pa. Particularly, in a case where the in-housing space 33 is in a high vacuum state, there is an advantage that even if an extremely small leakage occurs between the in-housing space 33 and the discharge space 6, the flow is wholly directed to the side of the in-housing space 33, thus does not influence a processed object.

The active gas generation apparatus 100 according to the embodiment 1 has a feature that it has a gas separation structure of separating a gas flow between the in-housing space 33 and the discharge space 6 by the cooling plate 9, the insulating plate 7, the electrode holding member 8, and the high voltage apply electrode part 1.

The separation of the gas flow between the in-housing space 33 and the discharge space 6 can be achieved by providing at least the cooling plate 9, the electrode holding member 8, and the high voltage apply electrode part 1.

The active gas generation apparatus 100 according to the embodiment 1 has the gas separation structure described above, thereby being able to reliably avoid a phenomenon that the impurity occurring in the in-housing space 33 enters the discharge space 6.

As a result, the active gas generation apparatus 100 according to the embodiment 1 can eject the high-quality active gas 52 which does not contain impurity without damaging the electrode dielectric films 11 and 12.

Furthermore, the cooling function of the cooling plate 9 including the cooling water path 90 functioning as the cooling medium path enables the cooling of the high voltage apply electrode part 1 via the insulating plate 7 (insulating material). Thus, a difference of temperature between regions in the dielectric film occurring in the electrode dielectric film 11 (first electrode dielectric film) having the lower surface forming the discharge space 6 can be reduced as small as possible.

The difference of temperature between regions in the dielectric film is described hereinafter. A thermal expansion by a discharge phenomenon in the discharge space 6 determines an upper limit of a power density. In the electrode dielectric film 11 of the high voltage apply electrode part 1, a temperature difference occurs between a discharge region where the electrode dielectric film 11 overlaps with the discharge space 6 in a plan view (a region where the metal electrode 10 is formed) and a non-discharge region other than the discharge region. This temperature difference becomes the difference of temperature between regions in the dielectric film.

When the difference of temperature between regions in the dielectric film gets large, a difference of thermal expansion increases, thus a risk of damage on the electrode dielectric film 11 increases. When the cooling plate 9 cools the electrode dielectric film 11 via the insulating plate 7 and the metal electrode 10, thereby being able to minimize the difference of temperature between regions in the dielectric film as much as possible, higher discharge power can be applied.

Accordingly, the active gas generation apparatus 100 according to the embodiment 1 can increase the discharge power applied to the discharge space 6 by suppressing the difference of temperature between regions in the dielectric film described above, thus can increase a generation amount of the active gas 52.

The insulating plate 7 is provided between the cooling plate 9 and the metal electrode 10, thus a short-circuit phenomenon that the metal electrode 10 and the cooling plate 9 are electrically connected can be reliably avoided.

The above effect is described hereinafter. High potential is applied from the high frequency power source 50 to the metal electrode 10 of the high voltage apply electrode part 1, and the cooling plate 9 is grounded via the base flange 4. Accordingly, a short-circuit phenomenon that the cooling plate 9 and the metal electrode 10 have direct contact with each other needs to be avoided.

Thus, the short-circuit phenomenon between the metal electrode 10 and the cooling plate 9 in the high voltage apply electrode part 1 is reliably prevented by the insulating plate 7 formed of an insulating object.

(High Voltage Apply Electrode Part 1)

Figure 2:
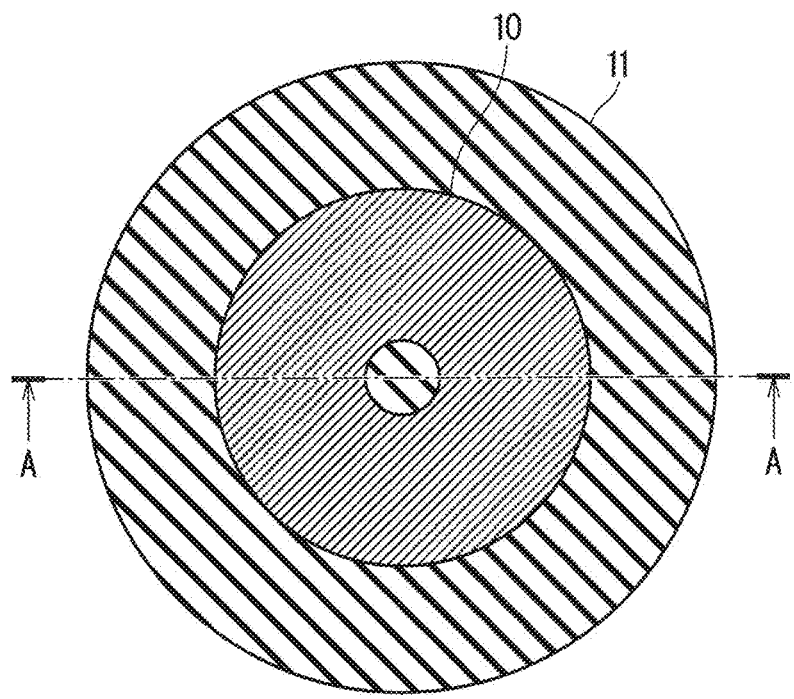
FIG. 2 A plan view illustrating an upper surface structure of a high voltage apply electrode part illustrated in FIG. 1.
Figure 2:
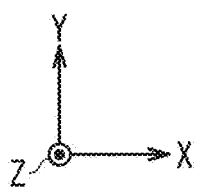
Figure 3:
FIG. 3 A cross-sectional view illustrating a cross-section structure of the high voltage apply electrode part.
Figure 3:
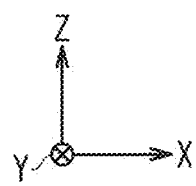

FIG. 2 is a plan view illustrating an upper surface structure of the high voltage apply electrode part 1 illustrated in FIG. 1, and FIG. 3 is a cross-sectional view illustrating a cross-section structure of the high voltage apply electrode part 1. An A-A cross section in FIG. 2 corresponds to FIG. 3. An XYZ rectangular coordinate system is illustrated in each of FIG. 2 and FIG. 3.

As illustrated in FIG. 1 to FIG. 3, the electrode dielectric film 11 of the high voltage apply electrode part 1 has a circular shape in a plan view.

The metal electrode 10 is provided on the upper surface of the electrode dielectric film 11, and formed into an annular shape having an opening in a central portion.

(Ground Potential Electrode Part 2)

Figure 4:
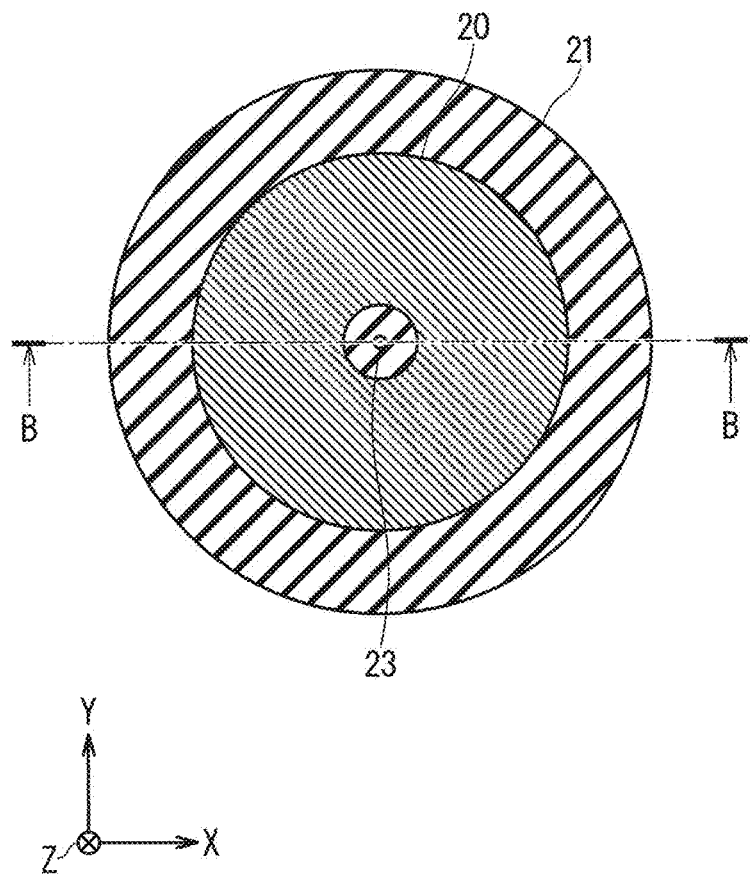
FIG. 4 A plan view illustrating a lower surface structure of a ground potential electrode part illustrated in FIG. 1.
Figure 5:
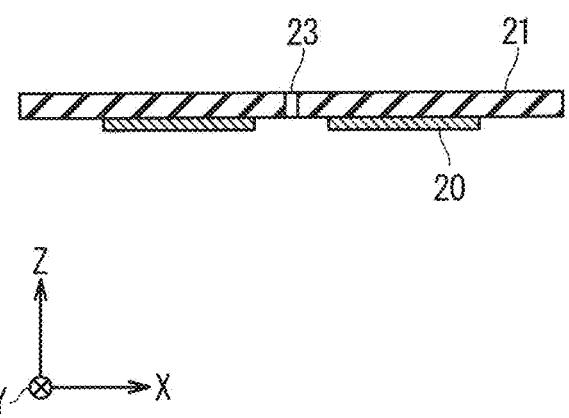
FIG. 5 A cross-sectional view illustrating a cross-section structure of the ground potential electrode part illustrated in FIG. 1.

FIG. 4 is a plan view illustrating a lower surface structure of the ground potential electrode part 2 illustrated in FIG. 1, and FIG. 5 is a cross-sectional view illustrating a cross-section structure of the ground potential electrode part 2. A B-B cross section in FIG. 4 corresponds to FIG. 5. An XYZ rectangular coordinate system is illustrated in each of FIG. 4 and FIG. 5.

As illustrated in FIG. 1, FIG. 4, and FIG. 5, the electrode dielectric film 21 of the ground potential electrode part 2 has a circular shape in a plan view.

The metal electrode 20 is provided on the lower surface of the electrode dielectric film 21, and formed into an annular shape having an opening in a central portion.

The metal electrode 20 is formed to include the whole metal electrode 10 in a plan view, thus the discharge space 6 where the metal electrode 20 and the metal electrode 10 overlap with each other in a plan view is substantially defined by a formation region of the metal electrode 10. Accordingly, the discharge space 6 is formed into an annular shape centering on the gas ejection hole 23 in a plan view as with the metal electrode 10.

The ground potential electrode part 2 has, in a center position, the gas ejection hole 23 for ejecting the active gas 52 generated in the discharge space 6 to the lower side. The gas ejection hole 23 is formed to pass through the electrode dielectric film 21.

As illustrated in FIG. 4, the gas ejection hole 23 is provided in a center position of the opening part of the metal electrode 20 without overlapping with the metal electrode 20 in a plan view.

A hole diameter of the gas ejection hole 23 is set to be sufficiently small, thus the gas ejection hole 23 can have an orifice function. In the present specification, "the orifice function" indicates a function of reducing pressure in a region after the gas passes through a gas passing part (the gas ejection hole 23) to less than pressure in a region before the gas passes through the gas passing part regarding the region before and after the gas passes therethrough.

Specifically, when a length of a diameter q of the gas ejection hole 23 is set to 0.69 mm, a formation depth thereof is set to 1 mm, and a gas flow amount of the material gas 5 is set to 1 slm, an upstream side pressure in the gas ejection hole 23 can be set to approximately 30 kPa while a downstream side pressure thereof is 266 Pa (absolute pressure).

In this manner, the gas ejection hole 23 having the orifice function is formed in the ground potential electrode part 2. Thus, a pressure difference occurs between a downstream side of the active gas generation apparatus 100 and the discharge space 6 on an upstream side, and pressure in the discharge space 6 is maintained at around 10 kPa to 30 kPa.

(Base Flange 4)

Figure 6:
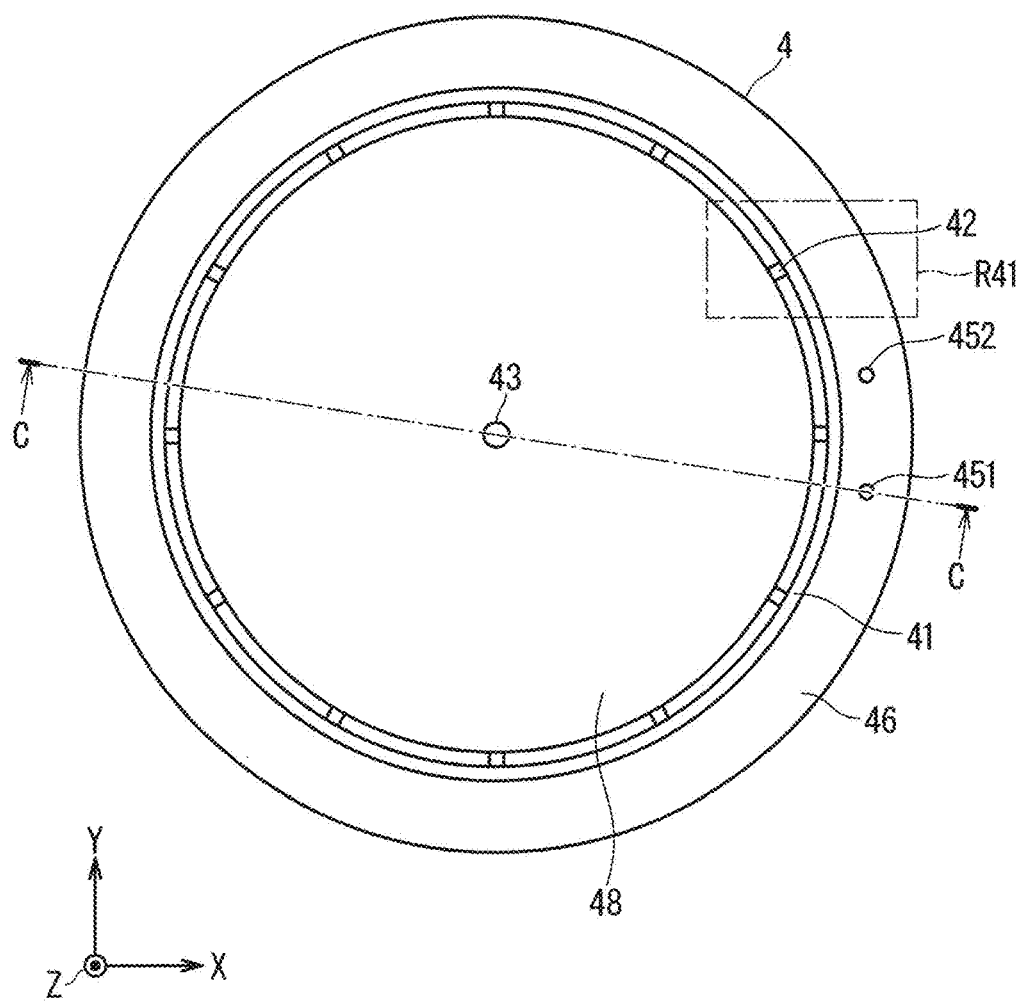
FIG. 6 A plan view illustrating a planar structure of a base flange illustrated in FIG. 1.
Figure 7:
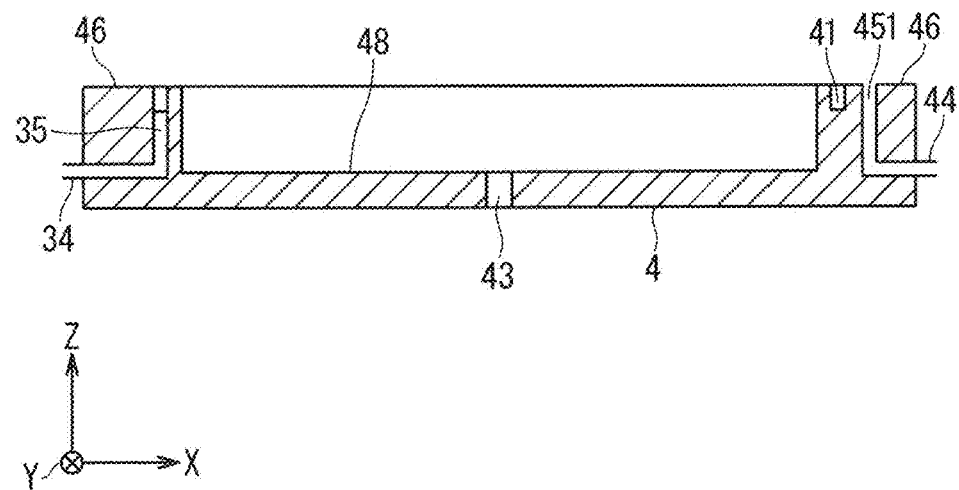
FIG. 7 A cross-sectional view illustrating a cross-section structure of the base flange illustrated in FIG. 1.
Figure 8:
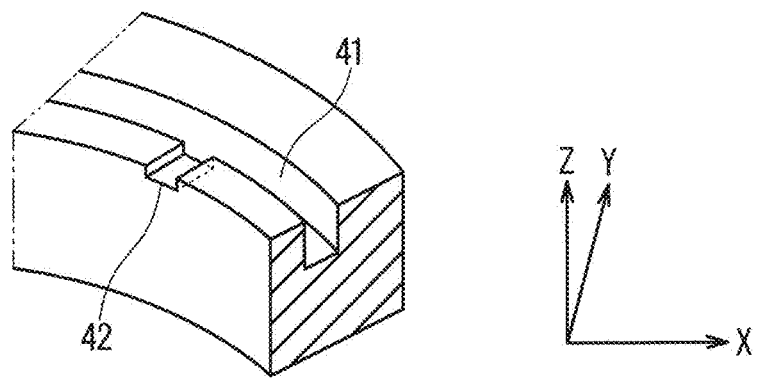
FIG. 8 A perspective view illustrating a detail of a gas buffer and a gas diffusion path.

FIG. 6 is a plan view illustrating a planar structure of the base flange 4 illustrated in FIG. 1, and FIG. 7 is a cross-sectional view illustrating a cross-section structure of the base flange 4. FIG. 8 is a perspective view illustrating a detail of the gas buffer 41 and the gas diffusion path 42 described hereinafter. A C-C cross section in FIG. 6 corresponds to FIG. 7. An XYZ rectangular coordinate system is illustrated in each of FIG. 6 and FIG. 8.

Ground potential is supplied to the base flange 4 made of metal and having conductivity. As illustrated in FIG. 1 and FIG. 6 to FIG. 8, the base flange 4 has a circular shape in a plan view, and has a concave shape structure in a cross-sectional view. The base flange 4 includes the central bottom surface region 48 having a circular shape in a plan view and the peripheral protruding part 46 provided along an outer periphery of the central bottom surface region 48, protruding to an upper side (+Z direction), and having an annular shape.

The base flange 4 includes the gas ejection hole 43 (the base flange gas ejection hole) in a center position of the central bottom surface region 48. The gas ejection hole 43 passes through the base flange 4.

The gas ejection hole 43 of the base flange 4 corresponds to the gas ejection hole 23, and is formed in a position coinciding with the gas ejection hole 23 in the upper surface in a plan view. That is to say, the gas ejection hole 43 is provided immediately below the gas ejection hole 23.

A hole diameter of the gas ejection hole 43 is set to be sufficiently small, thus the gas ejection hole 43 can have an orifice function. In this case, "the orifice function" indicates a function of reducing pressure in a region after the gas passes through the gas ejection hole 43 which is the gas passing part to less than pressure in a region before the gas passes through the gas ejection hole 43 regarding the region before and after the gas passes therethrough.

However, the active gas 52 generated in the discharge space 6 has a longer life as the pressure decreases, thus it is preferable that the gas ejection hole 23 closer to the discharge space 6 has the orifice function compared with the gas ejection hole 43.

The central bottom surface region 48 and the peripheral protruding part 46 are provided in an area ranging from the center position of the base flange 4 to a peripheral area thereof, and the plurality of gas diffusion paths 42 and the gas buffer 41 are provided in an inner peripheral region of the peripheral protruding part 46.

The gas buffer 41 which is a gas internal flow path is connected to the gas transmission path 35, and is formed into an annular shape surrounding the gas relay region R4 in a plan view. As illustrated in FIG. 7 and FIG. 8, the gas buffer 41 has a groove structure in which a groove is formed in a cross-sectional view, thus can temporarily house the material gas 5.

The plurality of gas diffusion paths 42 are discretely provided between the gas buffer 41 which functions as the gas internal flow path and the gas relay region R4. Accordingly, the material gas 5 flows from the gas buffer 41 to the gas relay region R4 through the plurality of gas diffusion paths 42.

As illustrated in FIG. 6, the plurality of gas diffusion paths 42 are discretely provided at regular intervals along a formation direction (a circumferential direction) of the gas buffer 41.

A formation width and a formation depth of each gas diffusion path 42 are set to be sufficiently small, thus the gas diffusion path 42 can have an orifice function. In this case, "the orifice function" indicates a function of reducing pressure in the gas relay region R4 after the gas passes through the gas diffusion path 42 to less than pressure in the gas buffer 41 before the gas passes through the gas diffusion path 42 regarding the region before and after the gas passes therethrough.

Considered specifically is a usage example that a gas flow amount of the material gas 5 is set to 1 slm for the twenty-four gas diffusion paths 42 in total each having a structure that each gas diffusion path 42 has a width of 1 mm, a height of 0.4 mm, and a formation length (depth length) of 3.6 mm in relation to a gas traveling direction.

In this usage example, the pressure in the gas buffer 41 on an upstream side can be 70 Pa or more higher than a downstream side pressure in the gas diffusion path 42, that is 30 kPa (absolute pressure).

The material gas 5 supplied in the base flange 4 needs to be flowed evenly from an outer periphery 360° toward the discharge space 6. The reason is that when the material gas 5 is flowed into the discharge space 6 in an uneven state, a pressure difference proportional to the gas flow occurs in the discharge space 6, and thus the electrical discharge is ununiformed and a generation efficiency of the active gas 52 is reduced.

As illustrated in FIG. 7, in the base flange 4, the material gas 5 supplied from the gas supply port 34 passes through the gas transmission path 35. Subsequently, the material gas 5 can be temporarily remain in the whole periphery of the gas buffer 41, which is a groove annularly formed in a plan view, to surround the whole periphery.

The material gas 5 temporarily remaining in the gas buffer 41 flows in a central direction through the plurality of gas diffusion paths 42. At this time, each of the plurality of gas diffusion paths 42 has the orifice function, thus a pressure difference occurs between an upstream side and a downstream side of the plurality of gas diffusion paths 42, and the material gas 5 can be evenly supplied to the whole periphery of the gas buffer 41 by the pressure difference. At this time, the pressure difference between the upstream side and the downstream side is preferably equal to or larger than 70 Pa, at least.

In this manner, the active gas generation apparatus 100 has a feature that each gas diffusion path 42 is formed with a relatively small dimension so that the pressure in the gas buffer 41 which is the gas internal flow path is higher than the pressure in the gas relay region R4.

The active gas generation apparatus 100 according to the embodiment 1 has the above feature, thus the material gas 5 can be evenly flowed in the whole periphery of the annular gas buffer 41.

As a result, the active gas generation apparatus 100 according to the embodiment 1 can supply the material gas evenly flowed in the gas buffer 41 with a relatively small disbalance through the plurality of gas diffusion paths 42 and the gas relay region R4. Thus, the active gas generation apparatus 100 can generate the active gas 52 with a relatively high generation efficiency.

As described above, each of the metal electrodes 10 and 20 are formed into the annular shape in a plan view, thus the discharge space 6 is formed into the annular shape in an inner side of the gas buffer 41 via the gas relay region R4. The gas ejection hole 23 is provided in a further inner side of the discharge space 6.

The plurality of gas diffusion paths 42 disposed discretely are provided at regular intervals along the formation direction of the gas buffer 41. Thus, the active gas generation apparatus 100 according to the embodiment 1 can stably supply a predetermined amount of material gas 5 to the discharge space 6 via the gas relay region R4.

As a result, the active gas generation apparatus 100 according to the embodiment 1 can stably output a predetermined generation amount of active gas to the external processing space 63 via the gas ejection hole 23 and the gas ejection hole 43.

(Insulating Plate 7)

Figure 9:
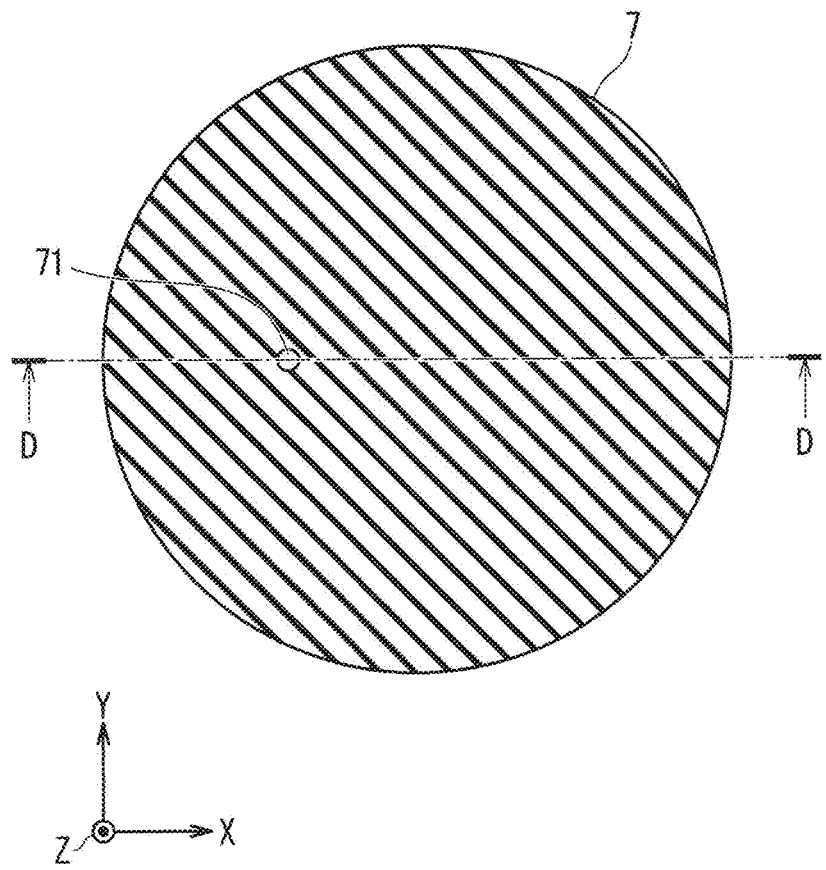
FIG. 9 A plan view illustrating a planar structure of an insulating plate illustrated in FIG. 1.
Figure 10:
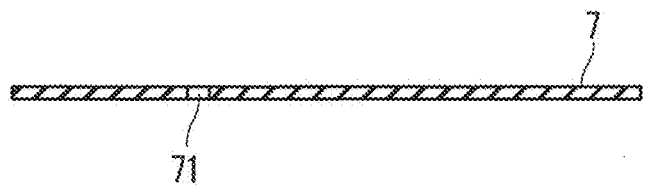
FIG. 10 A cross-sectional view illustrating a cross-section structure of the insulating plate illustrated in FIG. 1.

FIG. 6 is a plan view illustrating a planar structure of the insulating plate 7 illustrated in FIG. 1, and FIG. 10 is a cross-sectional view illustrating a cross-section structure of the insulating plate 7. A D-D cross section in FIG. 9 corresponds to FIG. 10. An XYZ rectangular coordinate system is illustrated in each of FIG. 9 and FIG. 10.

As illustrated in FIG. 9 and FIG. 10, the insulating plate 7 which is the insulating material is formed in a circular shape in a plan view, and partially has a conduction hole 71 passing through the insulating plate 7. The conduction hole 71 functions as a transmission hole for the electrical wire applying the AC voltage to the metal electrode 10.

The insulating plate 7 is formed of an insulating body of alumina, Shapal, aluminum nitride, for example. The insulating plate 7 has a configuration that when the insulating plate 7 tightly adheres to the metal electrode 10 of the high voltage apply electrode part 1, electrical discharge heat occurring in the high voltage apply electrode part 1 is removed and transmitted to the cooling plate 9.

As described hereinafter, the insulating plate 7 has a region overlapping with the cooling water path 90 which is the cooling medium path of the cooling plate 9 in a plan view.

The insulating plate 7 of the active gas generation apparatus 100 has the region overlapping with the cooling water path 90 of the cooling plate 9 in a plan view, thus the cooling plate 9 can effectively cool the high voltage apply electrode part 1 which is the first electrode constituting part via the insulating plate 7.

(Electrode Holding Member 8)

Figure 11:
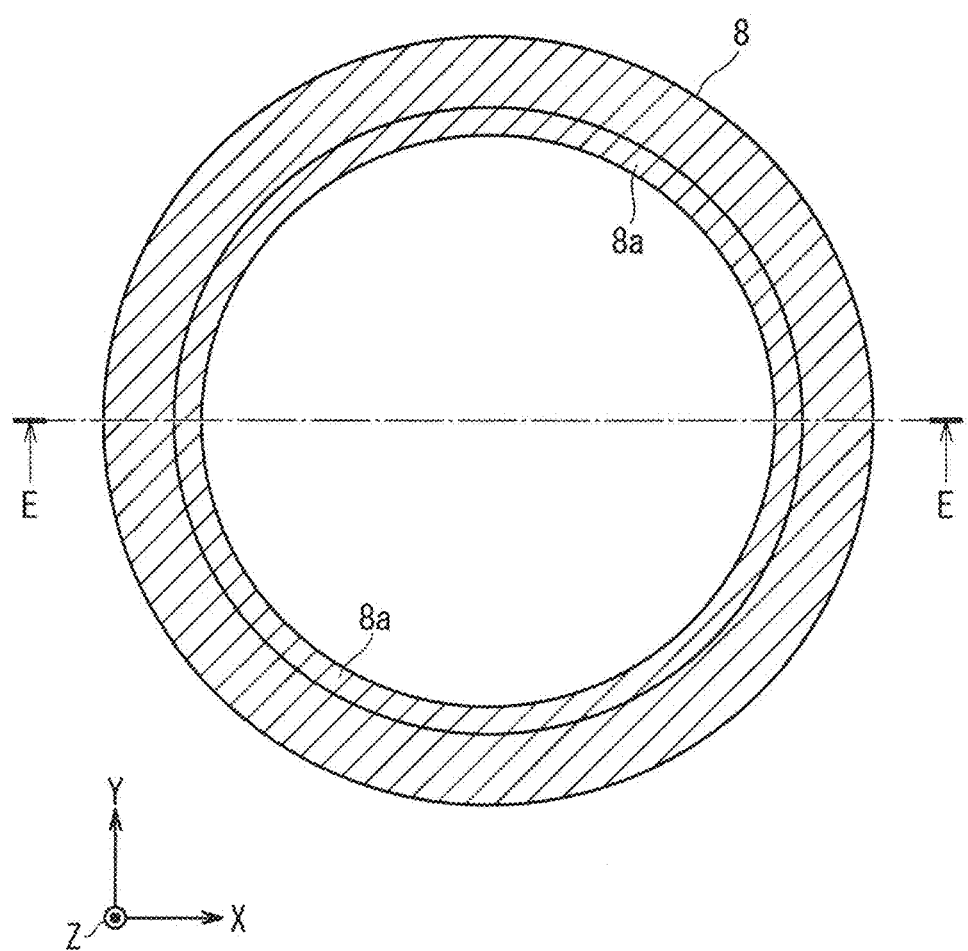
FIG. 11 A plan view illustrating a planar structure of an electrode holding member illustrated in FIG. 1.
Figure 12:
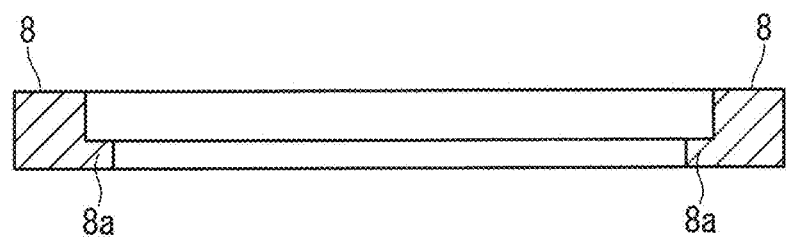
FIG. 12 A cross-sectional view illustrating a cross-section structure of the electrode holding member illustrated in FIG. 1.
Figure 12:
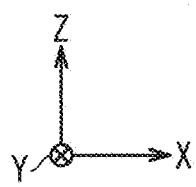

FIG. 11 is a plan view illustrating a planar structure of the electrode holding member 8 illustrated in FIG. 1, and FIG. 12 is a cross-sectional view illustrating a cross-section structure of the electrode holding member 8. An E-E cross section in FIG. 11 corresponds to FIG. 12. An XYZ rectangular coordinate system is illustrated in each of FIG. 11 and FIG. 12.

As illustrated in FIG. 1, the electrode holding member 8 which is the metal electrode support member is a member for pressing the upper electrode group including the high voltage apply electrode part 1 and the insulating plate 7 from a lower side, and has the annular shape in a plan view. The electrode holding member 8 includes, on a lower side, the pressing protruding part 8a protruding toward in an inner peripheral region. That is to say, the pressing protruding part 8a has an annular shape in a plan view.

As illustrated in FIG. 11 and FIG. 12, the pressing protruding part 8a of the electrode holding member 8 protrudes toward the inner side of the electrode dielectric film 11 with a predetermined protrusion length, and is provided so that an upper surface of the pressing protruding part 8a has contact with part of the lower surface of the electrode dielectric film 11. As illustrated in FIG. 12, a protrusion direction of the pressing protruding part 8a is a direction parallel to a horizontal surface (XY plane).

(Cooling Plate 9)

Figure 13:
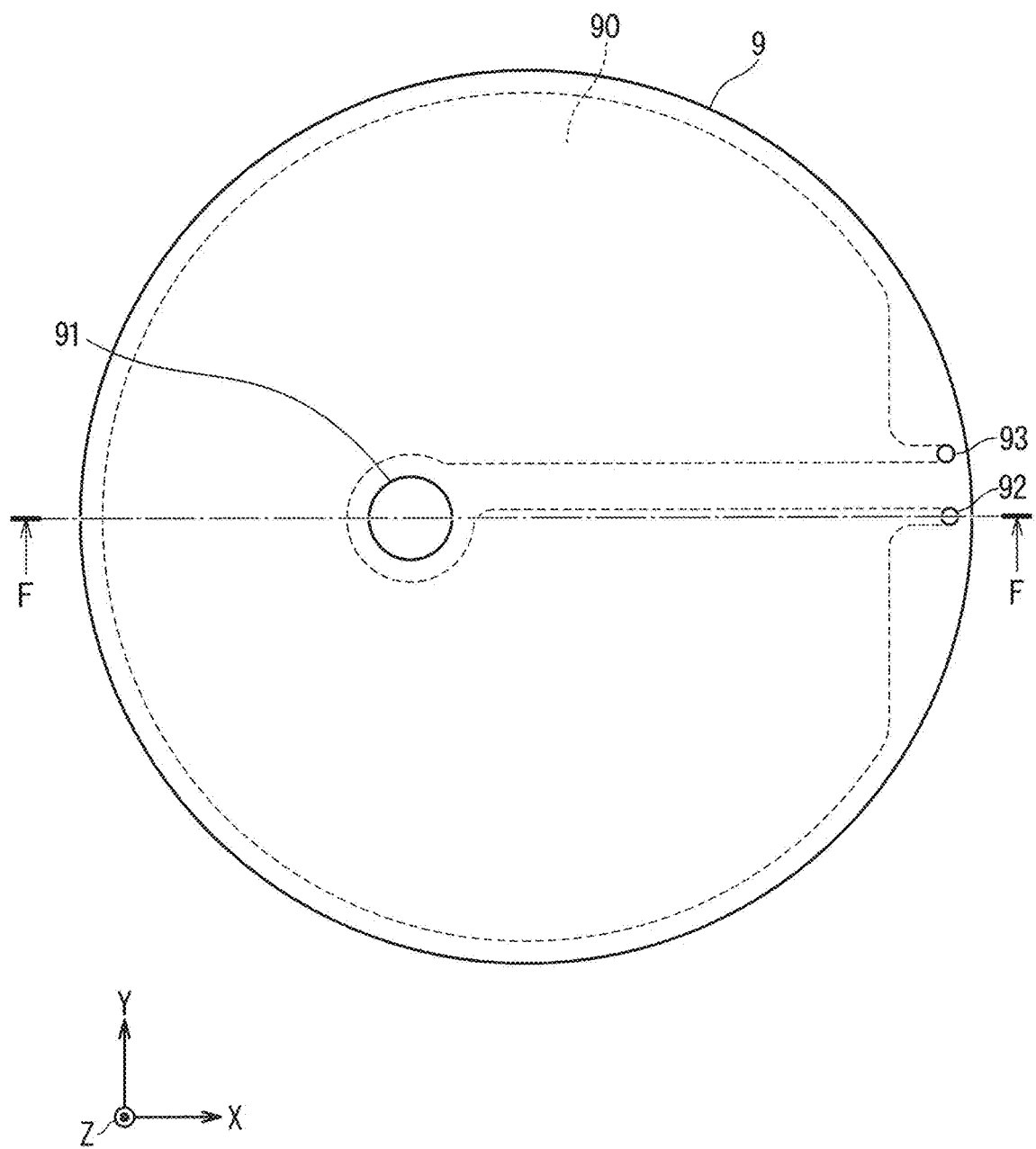
FIG. 13 A plan view illustrating a planar structure of a cooling plate illustrated in FIG. 1.
Figure 14:
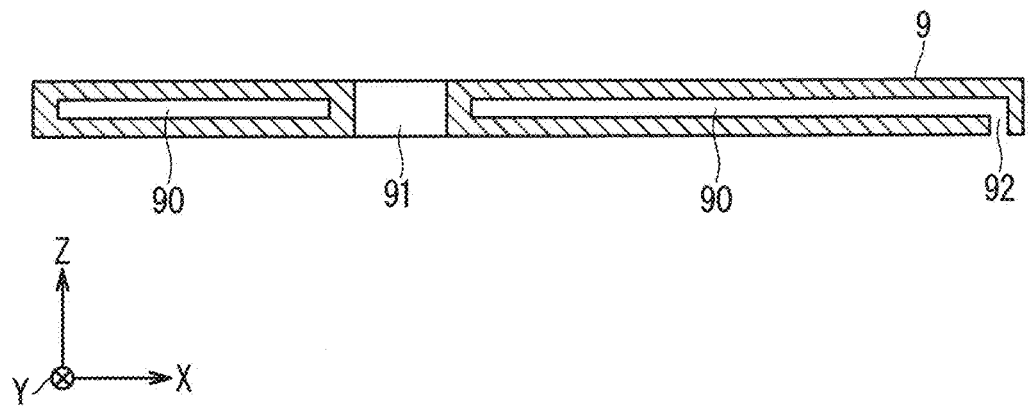
FIG. 14 A cross-sectional view illustrating a cross-section structure of the cooling plate illustrated in FIG. 1.

FIG. 13 is a plan view illustrating a planar structure of the cooling plate 9 illustrated in FIG. 1, and FIG. 14 is a cross-sectional view illustrating a cross-section structure of the cooling plate 9. A F-F cross section in FIG. 13 corresponds to FIG. 14. An XYZ rectangular coordinate system is illustrated in each of FIG. 13 and FIG. 14.

As illustrated in FIG. 1, FIG. 13, and FIG. 14, the cooling plate 9 includes the cooling water path 90 in an inner portion. The cooling water path 90 is a region through which cooling water flowed through the cooling water supply port 92 passes, and the cooling water is emitted from a cooling water outlet 93.

The cooling plate 9 partially includes a conduction hole 91 passing through the cooling plate 9. The conduction hole 91 functions as a transmission hole for the electrical wire applying the AC voltage from the high frequency power source 50 to the metal electrode 10. Accordingly, the electrical wire can be connected from the high frequency power source 50 to the metal electrode 10 via the conduction hole 91 of the cooling plate 9 and the conduction hole 71 of the insulating plate 7. The conduction hole 91 has an opening wide enough to prevent an electrical connection relationship between the electrical wire and the cooling plate 9.

The cooling water supply port 92 is provided in a position enabling to flow the cooling water supplied from the cooling water transmission hole 451. The cooling water outlet 93 is provided in a position enabling to supply the cooling water emitted from the cooling water path 90 to a cooling water transmission hole 452 of the base flange 4.

Accordingly, in the base flange 4, the cooling water transmission hole 451 functions as the transmission hole for supplying the cooling water to the cooling water path 90 of the cooling plate 9, and the cooling water transmission hole 452 functions as the transmission hole for emitting the cooling water outside from the cooling plate 9 via the base flange 4.

As illustrated in FIG. 1, FIG. 13, and FIG. 14, the cooling plate 9 includes the cooling water path 90 in a major part of the region thereof except for the conduction hole 91. Accordingly, the insulating plate 7 includes a region overlapping with the major part of the cooling water path 90 of the cooling plate 9.

In this manner, the insulating plate 7 of the active gas generation apparatus 100 includes the region overlapping with the major part of the cooling water path 90 of the cooling plate 9 in a plan view, thus the cooling plate 9 can have a cooling function of effectively cooling the high voltage apply electrode part 1 via the insulating plate 7 by the cooling water flowing in the cooling water path 90.

(Comparison with the Other Apparatus)

Figure 18:
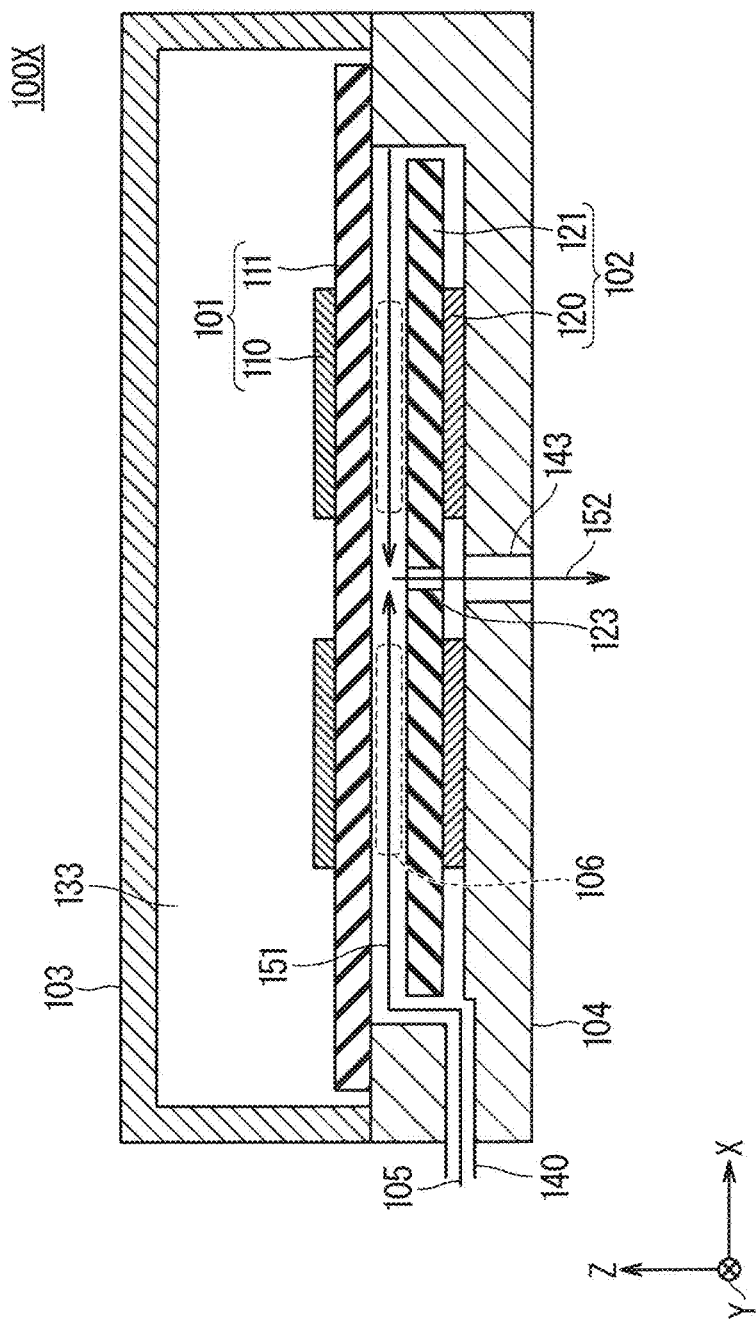
FIG. 18 A cross-sectional view illustrating a whole structure of an active gas generation apparatus for a first comparison.
Figure 19:
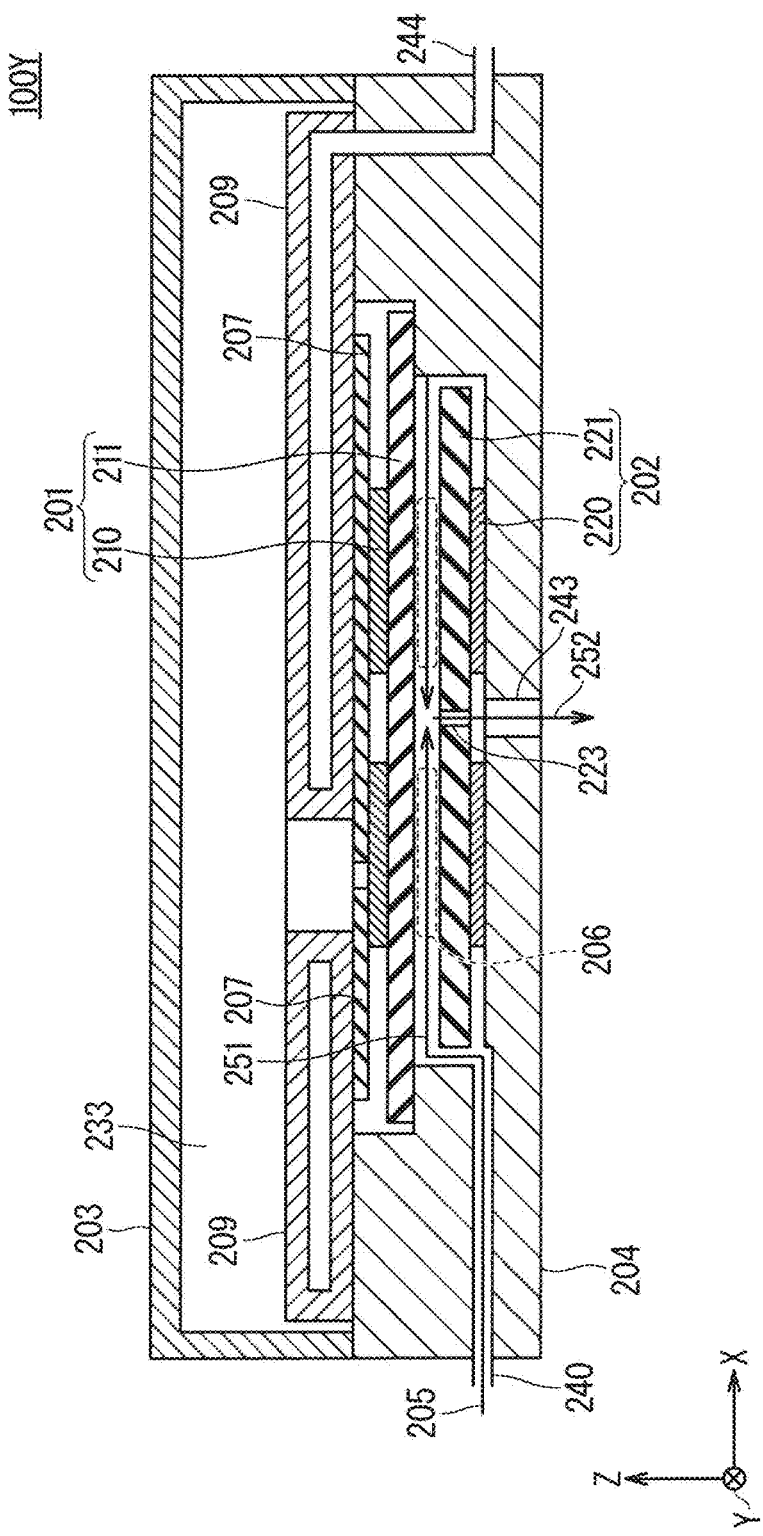
FIG. 19 A cross-sectional view illustrating a whole structure of an active gas generation apparatus for a second comparison.

FIG. 18 is a cross-sectional view illustrating a whole structure of an active gas generation apparatus 100X which is a first comparison apparatus, and FIG. 19 is a cross-sectional view illustrating a whole structure of an active gas generation apparatus 100Y which is a second comparison apparatus. An XYZ rectangular coordinate system is illustrated in each of FIG. 18 and FIG. 19.

As illustrated in FIG. 18, the active gas generation apparatus 100X for a first comparison includes a ground potential electrode part 102 (a metal electrode 120+an electrode dielectric film 121) on a central bottom surface region in a base flange 104 and a high voltage apply electrode part 101 (a metal electrode 110+an electrode dielectric film 111) on a peripheral protruding part of the base flange 104. At this time, sealing is performed on a contact surface of the high voltage apply electrode part 101 and the base flange 104.

The material gas 105 is supplied from the gas supply port 140 provided on a side surface of the peripheral protruding part of the base flange 104 to the discharge space 106.

In the active gas generation apparatus 100X, the material gas 105 supplied from the gas supply port 140 is supplied to a discharge space 106. Then, the material gas 105 is output as active gas 152 via a gas ejection hole 123 of the electrode dielectric film 121 and a gas ejection hole 143 of the base flange 104.

Also in the active gas generation apparatus 100X, a gas flow 151 of the material gas 105 is separated between an in-housing space 133 in a metal housing 103 and the discharge space 106 by the electrode dielectric film 111 of the high voltage apply electrode part 101.

However, the active gas generation apparatus 100X does not include a cooling means corresponding to the cooling plate 9, thus a discharge power density in the discharge space 6 cannot be increased to a certain level or more. Thus, there is a problem that a generation amount of the active gas 152 cannot be increased.

As illustrated in FIG. 19, an active gas generation apparatus 100Y for a second comparison includes a ground potential electrode part 202 (a metal electrode 220+an electrode dielectric film 221) on a central bottom surface region in a base flange 204. A high voltage apply electrode part 201 (a metal electrode 210+an electrode dielectric film 211) is disposed on an intermediate protruding region of the base flange 204. At this time, sealing is performed on a contact surface of the high voltage apply electrode part 201 and the base flange 204. An insulating plate 207 is further disposed on the high voltage apply electrode part 201.

A cooling plate 209 is provided on an end portion protruding region in the base flange 204. In this manner, the base flange 204 is formed into a step-like form from a center to a peripheral part in a cross-sectional view.

The material gas 205 is supplied from a gas supply port 240 provided on one side surface of the base flange 204, and the cooling water is supplied to the cooling plate 209 from a cooling water supply port 244 provided on the other side surface of the base flange 204.

In the active gas generation apparatus 100Y, the material gas 205 supplied from the gas supply port 240 is supplied to a discharge space 206. Then, the material gas 205 is output as active gas 252 via a gas ejection hole 223 of the electrode dielectric film 221 and a gas ejection hole 243 of the base flange 204.

Also in the active gas generation apparatus 100Y, a gas flow 251 of the material gas 205 is separated between an in-housing space 233 in a metal housing 203 and the discharge space 206 by the high voltage apply electrode part 201, the insulating plate 207, and the cooling plate 209. The active gas generation apparatus 100Y further cools the high voltage apply electrode part 201 by the cooling plate 209.

However, the active gas generation apparatus 100Y does not include a means corresponding to the electrode holding member 8 in the embodiment 1, thus has a structure that the cooling plate 209 is attached to the base flange 204 while sandwiching the high voltage apply electrode part 201 and the insulating plate 207.

In this case, positioning of the cooling plate 209 in a height direction needs to be performed in accordance with a formation height of the end portion protruding region in the base flange 204 (first dimension) and a combination thickness of a member formed of the high voltage apply electrode part 201 and the insulating plate 207 overlapping with each other (second dimension).

Accordingly, there is a problem that if a difference occurs between the first and second dimensions, the cooling water or the material gas 205 may be leaked.

The problem described above is described in detail hereinafter. Herein, the first dimension is referred to as a level difference D1 and the second dimension is referred to as a thickness D2.

When the thickness D2 is smaller than the level difference D1, gas leakage occurs. When the cooling plate 9 is attached to the base flange 4 with a bolt, the high voltage apply electrode part 201 is pressed against the base flange 204 with the insulating plate 207 therebetween. As a result, an O ring (not shown) between the high voltage apply electrode part 201 and the base flange 204 are crushed, thereby sealing the high voltage apply electrode part 201 and the base flange 204.

In this manner, the high voltage apply electrode part 201 is not directly attached to the base flange 204. The reason is that if the high voltage apply electrode part 201 is directly attached to the base flange 204 with a dedicate fastening bolt, outer diameters of the high voltage apply electrode part 201 and the base flange 204 further increase to ensure a space for arranging the fastening bolt, thus such a configuration is not practical.

However, when the thickness D2 is smaller than the level difference D1, the high voltage apply electrode part 1 is not sufficiently pressed against the base flange 4, and as a result, the O ring located therebetween is not sufficiently crushed. Furthermore, there is a high possibility that a gap occurs between the insulating plate 207 and the cooling plate 209.

As a result, there is a high possibility that a gap occurs between the high voltage apply electrode part 1 and the base flange 4 and between the insulating plate 207 and the cooling plate 209, thus the cooling water or the material gas 205 may be leaked.

In this manner, the problem occurs in the first and second comparison structures which does not include at least one of the insulating plate 7, the electrode holding member 8, and the cooling plate 9 in the embodiment 1, and the effect in the active gas generation apparatus 100 according to the embodiment 1 cannot be achieved.

Embodiment 2

Figure 15:
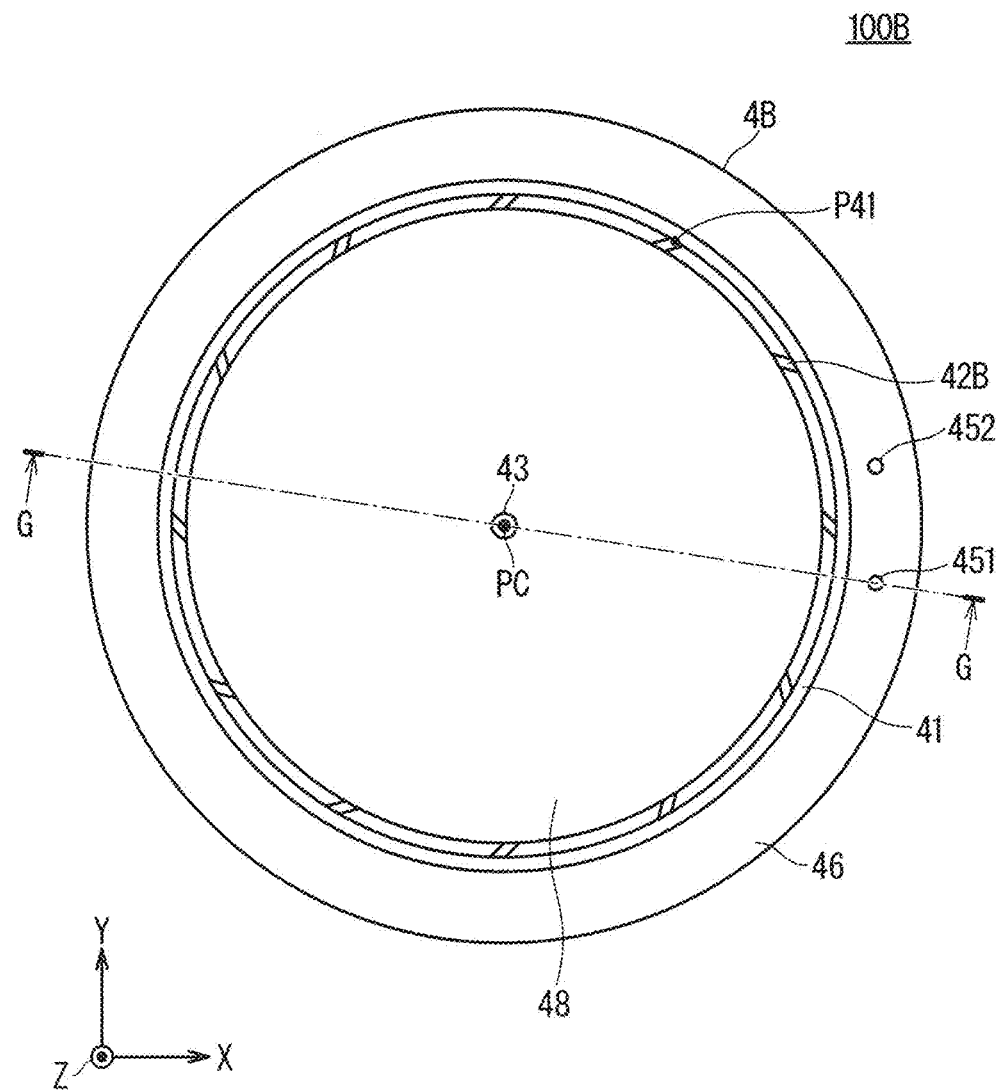
FIG. 15 A plan view illustrating a planar structure of a base flange according to an embodiment 2.
Figure 16:
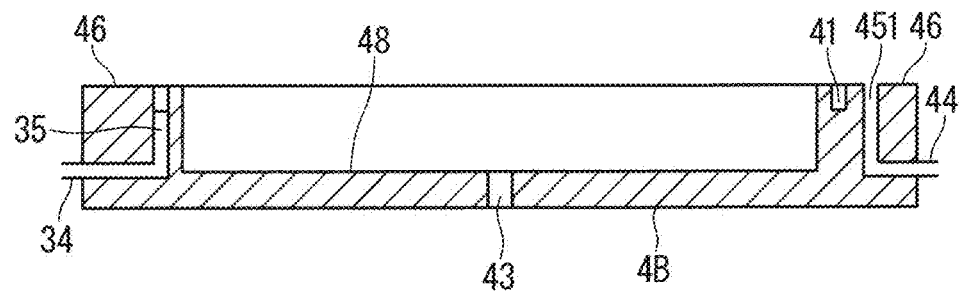
FIG. 16 A cross-sectional view illustrating a cross-section structure of the base flange according to the embodiment 2.
Figure 16:
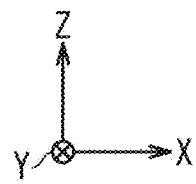
Figure 17:
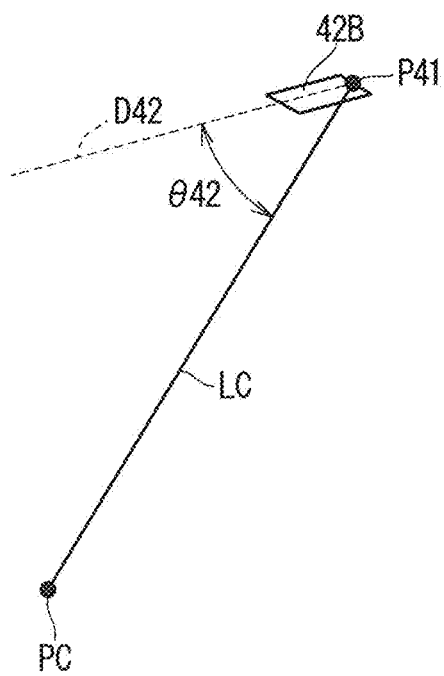
FIG. 17 An explanation diagram schematically illustrating a feature of a gas diffusion path in a formation direction.

FIG. 15 is a plan view illustrating a planar structure of a base flange 4B according to an embodiment 2, and FIG. 16 is a cross-sectional view illustrating a cross-section structure of a base flange 4B. FIG. 17 is an explanation diagram schematically illustrating a feature of a gas diffusion path 42B in a direction in which a diffusion path is formed. A G-G cross section in FIG. 15 corresponds to FIG. 16. An XYZ rectangular coordinate system is illustrated in each of FIG. 15 and FIG. 16.

An active gas generation apparatus 100B according to the embodiment 2 has a structure similar to the active gas generation apparatus 100 according to the embodiment 1 except that the base flange 4 is replaced with a base flange 4B. The base flange 4B is mainly described hereinafter.

(Base Flange 4B)

As illustrated in FIG. 15 to FIG. 17, the base flange 4B has a circular shape in a plan view in the manner similar to the base flange 4, and the base flange 4B includes the gas ejection hole 43 (base flange gas ejection hole) in a center. The gas ejection hole 43 passes through the base flange 4B. Ground potential is supplied to the base flange 4B made of metal and having conductivity.

The gas buffer 41 which is a gas internal flow path is connected to the gas transmission path 35, and is formed into an annular shape surrounding the gas relay region R4 in a plan view. As illustrated in FIG. 15 and FIG. 16, the gas buffer 41 has a groove structure in which a groove is formed in a cross-sectional view, thus can temporarily house the material gas 5.

A plurality of gas diffusion paths 42B are discretely provided between the gas buffer 41 which functions as the gas internal flow path and the gas relay region R4. Accordingly, the material gas 5 flows from the gas buffer 41 to the gas relay region R4 through the plurality of gas diffusion paths 42B.

As illustrated in FIG. 15, the plurality of gas diffusion paths 42B are discretely provided at regular intervals along a formation direction (a circumferential direction) of the gas buffer 41.

A formation width and a formation depth of the gas diffusion path 42B are set to be sufficiently small, thus the gas diffusion path 42B can have an orifice function in the manner similar to the gas diffusion path 42.

As illustrated in FIG. 16, in the base flange 4B, the material gas 5 emitted from the gas supply port 34 passes through the gas transmission path 35. Subsequently, the material gas 5 is supplied to the whole periphery of the gas buffer 41 which is a groove annularly formed in a plan view to surround the whole periphery.

The material gas 5 temporarily remaining in the gas buffer 41 flows in the gas relay region R4 through the plurality of gas diffusion paths 42B. At this time, the plurality of gas diffusion paths 42B are formed as small grooves in an orifice form, thus a pressure difference occurs between an upstream side and a downstream side of the gas diffusion paths 42B, and gas can be evenly supplied to the whole periphery of the gas buffer 41 by the pressure difference. At this time, the pressure difference between the upstream side and the downstream side is preferably equal to or larger than 70 Pa, at least.

Herein, the center position of the annular gas buffer 41 is referred to as a virtual center point PC. The virtual center point PC is also a center point of the gas ejection hole 43. Furthermore, as illustrated in FIG. 17, a line from a connection position P41 between each gas diffusion path 42B and the gas buffer 41 toward the virtual center point PC is referred to as a virtual center line LC.

In the embodiment 2, a diffusion path formation direction D42 of each of the plurality of gas diffusion paths 42B has a feature that a path angle θ42 with the virtual center line LC is set within a range of 30° to 60°. The path angle θ42 is preferably set to be the same in the plurality of gas diffusion paths 42B.

The active gas generation apparatus 100B according to the embodiment 2 has the feature described above, thus the material gas 5 supplied from each of the gas diffusion paths 42B to the gas relay region R4 spirals, and the material gas 5 can be evenly supplied to the discharge space 6 without occurrence of disbalance in the gas relay region R4.

As a result, the active gas generation apparatus 100B according to the embodiment 2 can generate the active gas 52 with a relatively high generation efficiency.

The above effect is described in detail hereinafter. In a case where the gas diffusion path 42 in which a direction toward the virtual center point PC is a diffusion path formation direction is provided as with the gas diffusion path 42 according to the embodiment 1 illustrated in FIG. 6, that is to say, in a case where a path angle of the diffusion path formation direction with the virtual center line LC is 0°, when the material gas 5 is supplied from the gas diffusion path 42 to the gas relay region R4, unevenness occurs in the gas flow of the material gas 5.

When the unevenness is not resolved before the material gas 5 reaches the discharge space 6, there is a possibility that a generation efficiency of the active gas 52 is reduced in the discharge space 6.

In the meanwhile, the path angle θ42 is set within a range of 45°±15° with respect to the gas diffusion path 42B and the virtual center line LC illustrated in FIG. 15 and FIG. 17, thus the flow of the material gas 5 has a spiral form and the material gas 5 flows more evenly to the discharge space 6, and unevenness of the gas flow of the material gas 5 does not occur.

When the path angle θ42 is 45°, expected is a minimization of a possibility that the unevenness of the gas flow of the material gas 5 occurs.

The active gas generation apparatus 100B according to the embodiment 2 has a gas separation structure of separating a gas flow between the in-housing space 33 and the discharge space 6 by at least the cooling plate 9, the electrode holding member 8, and the high voltage apply electrode part 1 as with the case in the embodiment 1.

The active gas generation apparatus 100B according to the embodiment 2 has the above gas separation structure, thus can eject the high-quality active gas 52 which does not contain impurity as with the case in the embodiment 1.

Furthermore, the active gas generation apparatus 100B includes the insulating plate 7 and the cooling plate 9 as with the case in the embodiment 1, thus can increase the generation amount of the active gas 52.

In addition, the base flange 4B of the active gas generation apparatus 100B includes the gas buffer 41 having the feature similar to that in the embodiment 1.

The active gas generation apparatus 100B can supply the material gas 5 in a spiral form without unevenness to the discharge space 6 through the plurality of the gas diffusion paths 42B and the gas relay region R4, thus can generate the active gas 52 with a high generation efficiency.

The plurality of gas diffusion paths 42B discretely disposed are provided at regular intervals along the formation direction of the gas buffer 41, thus a predetermined generation amount of active gas can be stably output to outside through the gas ejection hole 23 and the gas ejection hole 43 as with the case in the embodiment 1.

<Other>

In the embodiments described above, water is indicated as the cooling medium supplied to the cooling water path 90, a cooling medium such as Galden may also be used.

The present invention has been shown and described in detail, the foregoing description is in all aspects illustrative, thus the present invention is not limited thereto. It is therefore understood that numerous modification examples can be devised without departing from the scope of the invention.

The invention claimed is:

1. An active gas generation apparatus generating active gas obtained by activating material gas supplied to a discharge space, comprising:
a first electrode constituting part; and
a second electrode constituting part provided on a lower side of said first electrode constituting part, wherein
said first electrode constituting part includes a first electrode dielectric film and a first metal electrode formed on an upper surface of said first electrode dielectric film, said second electrode constituting part includes a second electrode dielectric film and a second metal electrode formed on a lower surface of said second electrode dielectric film, AC voltage is applied to said first metal electrode, said second metal electrode is set to ground potential, and a dielectric space where said first and second electrode dielectric films face each other includes a region where said first and second metal electrodes overlap with each other in a plan view as said discharge space,
said second electrode dielectric film includes a gas ejection hole for ejecting said active gas to a lower side of said active gas generation apparatus,
said active gas generation apparatus further comprising
a base flange having conductivity, having a cross-section structure with a concave shape, and including a central bottom surface region and a peripheral protruding part provided along an outer periphery of said central bottom surface region to protrude in a height direction, wherein said second electrode constituting part is provided so that said second metal electrode has contact with said central bottom surface region,
said active gas generation apparatus further comprising:
a cooling plate provided on the peripheral protruding part of the base flange and located above an upper side of said first electrode constituting part without contact with said first electrode constituting part;
an insulating material provided between said cooling plate and said first electrode constituting part, having an upper surface having contact with a lower surface of said cooling plate, and having a lower surface having contact with the upper surface of said first metal electrode;
an electrode support member provided on the lower surface of said cooling plate to support said first electrode constituting part from a lower side of said first electrode constituting part; and
a metal housing provided on said peripheral protruding part of said base flange and having an in-housing space housing said cooling plate, wherein
said base flange includes:
a gas supply port receiving said material gas from outside said active gas generation apparatus;
a gas transmission path for supplying said material gas to said discharge space;
a cooling medium supply port receiving a cooling medium from outside said active gas generation apparatus;
a cooling medium transmission hole for supplying said cooling medium to said cooling plate; and
a base flange gas ejection hole for ejecting said active gas ejected from said gas ejection hole to said lower side of said active gas generation apparatus;
ground potential is supplied to said base flange, said cooling plate includes
a cooling medium path transmitting said cooling medium supplied through said cooling medium transmission hole to an inner portion of said cooling plate, and
a gas separation structure of separating a gas flow between said in-housing space and said discharge space by said cooling plate is provided based on said cooling plate, said electrode support member, and said first electrode constituting part.

2. The active gas generation apparatus according to claim 1, wherein
said base flange includes:
a gas relay region connected to said discharge space;
a gas internal flow path with a groove structure connected to said gas transmission path, formed into an annular shape surrounding said gas relay region; and
a gas diffusion path provided between said gas internal flow path and said gas relay region, wherein said material gas flows from said gas internal flow path to said gas relay region through said gas diffusion path, and
said gas diffusion path is formed with a dimension so that pressure in said gas internal flow path is higher than pressure in said gas relay region.

3. The active gas generation apparatus according to claim 2, wherein
said discharge space is formed into an annular shape in an inner side of said gas internal flow path via said gas relay region,
said gas ejection hole is provided in an inner side of said discharge space,
said gas diffusion path includes a plurality of gas diffusion paths, and
said plurality of gas diffusion paths are provided at regular intervals along a formation direction of said gas internal flow path.

4. The active gas generation apparatus according to claim 3, wherein
a center position of said gas internal flow path having an annular shape is defined as a virtual center point, and
with regard to a diffusion path formation direction of each of said plurality of gas diffusion paths, a path angle of said diffusion path formation direction with a virtual center line is set within a range of 30° to 60°, the virtual center line is a line from a connection position between each of said plurality of gas diffusion paths and said gas internal flow path toward said virtual center point.

5. The active gas generation apparatus according to claim 1, wherein
said insulating material is a plate-like insulating plate, and
said insulating plate includes a region overlapping with said cooling medium path of said cooling plate in a plan view.

* * * * *